United States Patent [19]
Gill

[11] Patent Number: 6,052,263
[45] Date of Patent: Apr. 18, 2000

[54] LOW MOMENT/HIGH COERCIVITY PINNED LAYER FOR MAGNETIC TUNNEL JUNCTION SENSORS

[75] Inventor: Hardayal Singh Gill, Portola Valley, Calif.

[73] Assignee: International Business Machines Corporation, Armonk, N.Y.

[21] Appl. No.: 09/138,120

[22] Filed: Aug. 21, 1998

[51] Int. Cl.$^7$ .............................. G11B 5/39; G01R 33/02
[52] U.S. Cl. ........................................... 360/113; 324/252
[58] Field of Search ............................ 360/113; 324/252; 338/32 R

[56] References Cited

U.S. PATENT DOCUMENTS

| | | | |
|---|---|---|---|
| 5,159,513 | 10/1992 | Dieny et al. | 360/113 |
| 5,206,590 | 4/1993 | Dieny et al. | 324/252 |
| 5,598,308 | 1/1997 | Dieny et al. | 360/113 |
| 5,650,958 | 7/1997 | Gallagher et al. | 365/173 |
| 5,661,621 | 8/1997 | Kobayashi et al. | 360/113 |
| 5,828,529 | 10/1998 | Gill | 360/113 |
| 5,856,897 | 1/1999 | Mauri | 360/113 |
| 5,880,913 | 3/1999 | Gill | 360/113 |
| 5,898,547 | 4/1999 | Fontana, Jr. et al. | 360/113 |
| 5,898,548 | 4/1999 | Gill et al. | 360/113 |
| 5,898,549 | 4/1999 | Gill | 360/113 |
| 5,920,446 | 7/1999 | Gill | 360/113 |
| 5,966,012 | 10/1999 | Parkin | 324/252 |

FOREIGN PATENT DOCUMENTS 10-4227  1/1998  Japan .

*Primary Examiner*—Jefferson Evans
*Attorney, Agent, or Firm*—Paik Saber; William D. Gill

[57] ABSTRACT

A magnetic tunnel junction (MTJ) device is usable as a magnetic field sensor in magnetic disk drives or as a memory cell in a magnetic random access (MRAM) array. The MTJ device has a ferromagnetic antiparallel (AP)-pinned layer comprising a first ferromagnetic layer, a second ferromagnetic layer and an antiparallel coupling (APC) layer disposed between the first and second ferromagnetic layers, a free ferromagnetic layer and an insulating tunnel barrier layer disposed between the first ferromagnetic layer of the AP-pinned layer and the free ferromagnetic layer. The magnetization of the AP-pinned layer is oriented in the plane of the layer but is fixed so as not to be able to rotate in the presence of an applied magnetic field in the range of interest. The magnetization of the free ferromagnetic layer is able to be rotated in the plane of the layer relative to the fixed magnetization of the ferromagnetic AP-pinned layer. The second ferromagnetic layer of the AP-pinned layer is formed of a high coercivity magnetic material which fixes the magnetization direction of the AP-pinned layer in a direction perpendicular to the air bearing surface. The net magnetic moment of the AP-pinned layer is made to be near zero to minimize magnetostatic interaction of the AP-pinned layer with the free layer.

36 Claims, 3 Drawing Sheets

LOW MOMENT/HIGH COERCIVITY PINNED LAYER FOR MAGNETIC TUNNEL JUNCTION SENSORS

BACKGROUND OF THE INVENTION

1. Field of the Invention

This invention relates generally to magnetic tunnel junction magnetoresistive sensors for reading information signals from a magnetic medium and, in particular, to magnetic tunnel junction sensors with low moment, high coercivity pinned layers, and to magnetic storage systems that incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of the SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of the arrow that is pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

The magnetization direction of the pinned layer of an MTJ sensor may be fixed (pinned) by the use of an antiferromagnetic (AFM) layer exchange coupled to the pinned layer. The advantage of using an AFM layer to fix the pinned layer magnetization is that magnetostatic interaction of the pinned layer with the free layer is small resulting in the free layer remaining magnetically soft. The disadvantage of using an exchange coupled AFM layer is that the exchange coupling becomes zero at the relatively low blocking temperature of the AFM material. The blocking temperatures of AFM materials having desirable high corrosion resistance properties are about 200° C. With such low blocking temperatures, these AFM materials have pinning fields with magnitudes less than 200 Oe at operating temperatures in the range of 120° C. of many MR sensors. These low pinning fields result in poor thermal stability of MR sensors operating at elevated temperatures.

Thermal stability can be greatly improved by using high coercivity (hard) magnetic materials for the pinned layer. With such materials, high pinning fields are maintained up to nearly the Curie temperature which can be about 700° C. However, high coercivity material pinned layers couple magnetostatically to the free layer resulting in a magnetically harder free layer having reduced sensitivity to external magnetic fields.

Therefore there is a need for an MTJ sensor that uses a high coercivity pinned layer to improve thermal stability without degrading the sensitivity of the sensor by magnetostatic interaction of the pinned layer and the free layer.

SUMMARY OF THE INVENTION

It is an object of the present invention to disclose an improved magnetoresistive tunnel junction (MTJ) sensor using a high coercivity magnetic material to fix the magnetization direction of an antiparallel (AP) pinned MTJ sensor.

It is another object of the present invention to disclose an MTJ sensor structure having high thermal stability due to use of a high coercivity magnetic material to fix the magnetization direction of the pinned layer.

It is a further object of the present invention to disclose an MTJ sensor structure having reduced magnetostatic coupling of the high coercivity pinning layer and the free layer.

In accordance with the principles of the present invention, there is disclosed an MTJ sensor having a laminated antiparallel (AP) pinned layer comprising a first ferromagnetic layer made of a material having a saturation magnetization greater than the magnetization of permalloy (about 800 emu/cc), a second ferromagnetic layer made of a high coercivity ferromagnetic material (high coercivity is here defined as a coercivity greater than 150 Oe), and an antiparallel coupling (APC) layer disposed between the first and second ferromagnetic layers. A ferromagnetic free layer comprising an interfacing first sub-layer and a second sub-layer of soft ferromagnetic material having a near zero magnetostriction coefficient is separated from the first ferromagnetic layer of the AP-pinned layer by a tunnel barrier layer formed of an insulating material adjacent to the first sub-layer of the free layer. The APC layer separating the first and second ferromagnetic layers of the AP-pinned layer promotes strong antiparallel coupling resulting in the magnetization of the high coercivity second ferromagnetic layer fixing the magnetization of the first ferromagnetic layer in an antiparallel direction.

In the preferred embodiment of the present invention, the magnetostatic interaction of the AP-pinned layer and the free layer is minimized by providing an AP-pinned layer structure having a near zero net magnetic moment. The thickness of the layers forming the AP-pinned layer are chosen so that the magnetic moments of the first and second ferromagnetic layers are nearly equal in magnitude. Since the magnetization of the first and second ferromagnetic layers have an antiparallel orientation due to the APC layer between them, the net moment of the AP-pinned layer is nearly zero. By minimizing the magnetostatic interaction of the AP-pinned layer with the free layer in this manner, the free layer magnetization can freely rotate in response to the applied field resulting in the MTJ sensor having high sensitivity.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
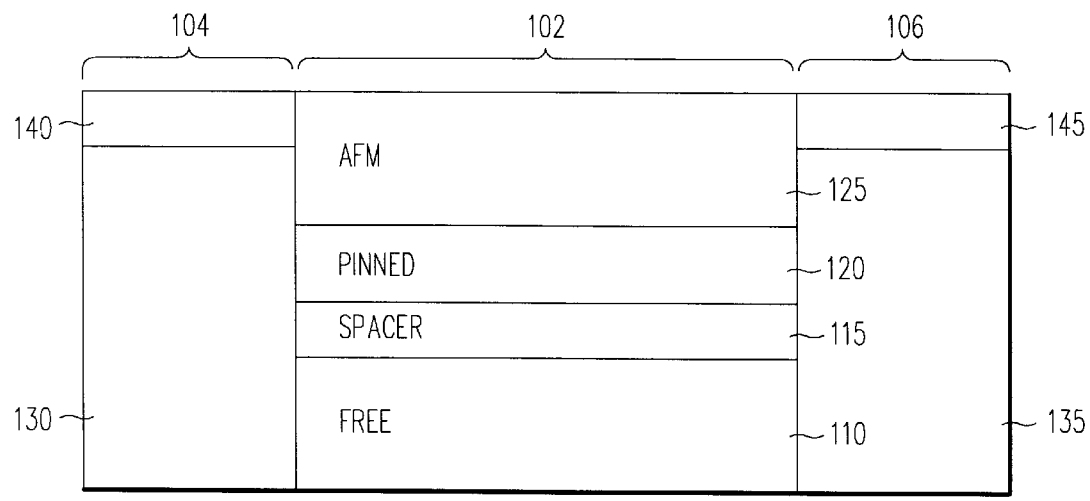
FIG. 1 is an air bearing surface view, not to scale, of a prior art SV sensor.
Figure 3:
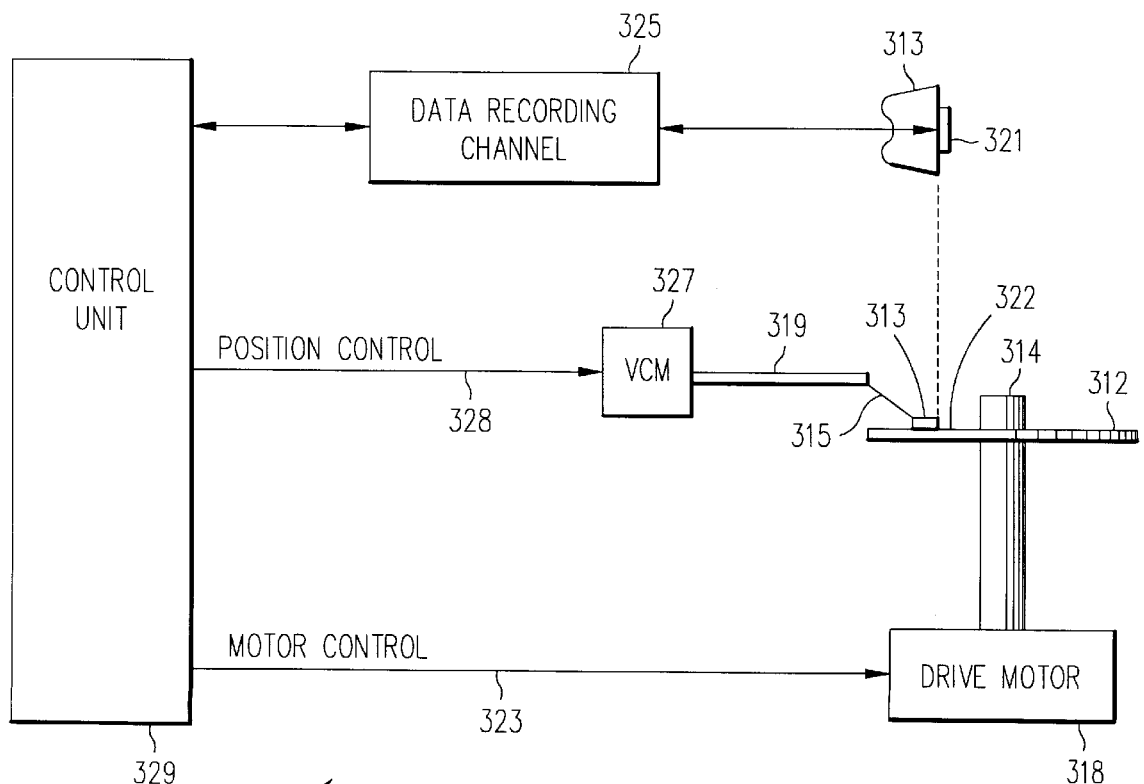
FIG. 3 is a simplified drawing of a magnetic recording disk drive system.
Figure 2:
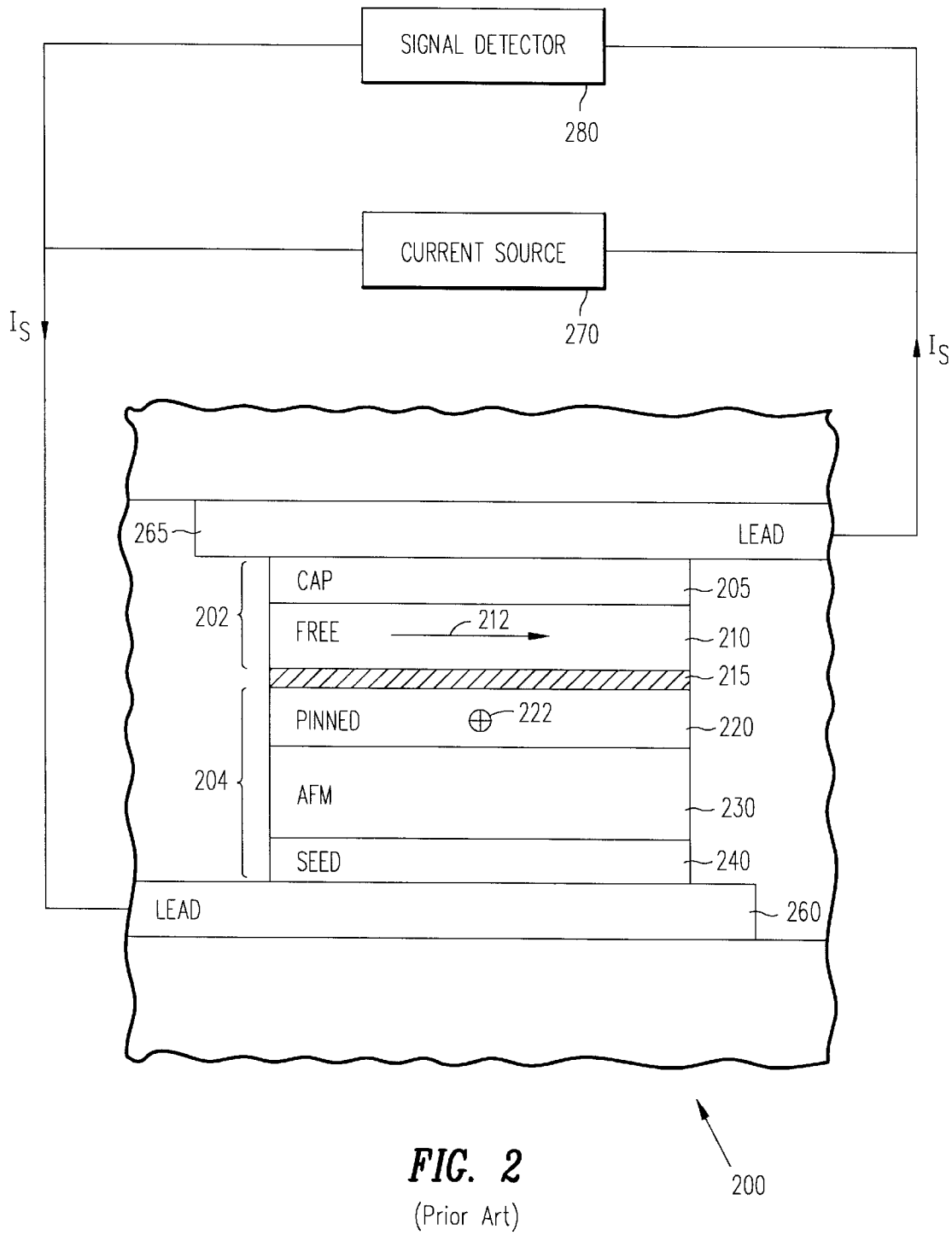
FIG. 2 is an air bearing surface view, not to scale, of a prior art magnetic tunnel junction sensor.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the MTJ sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
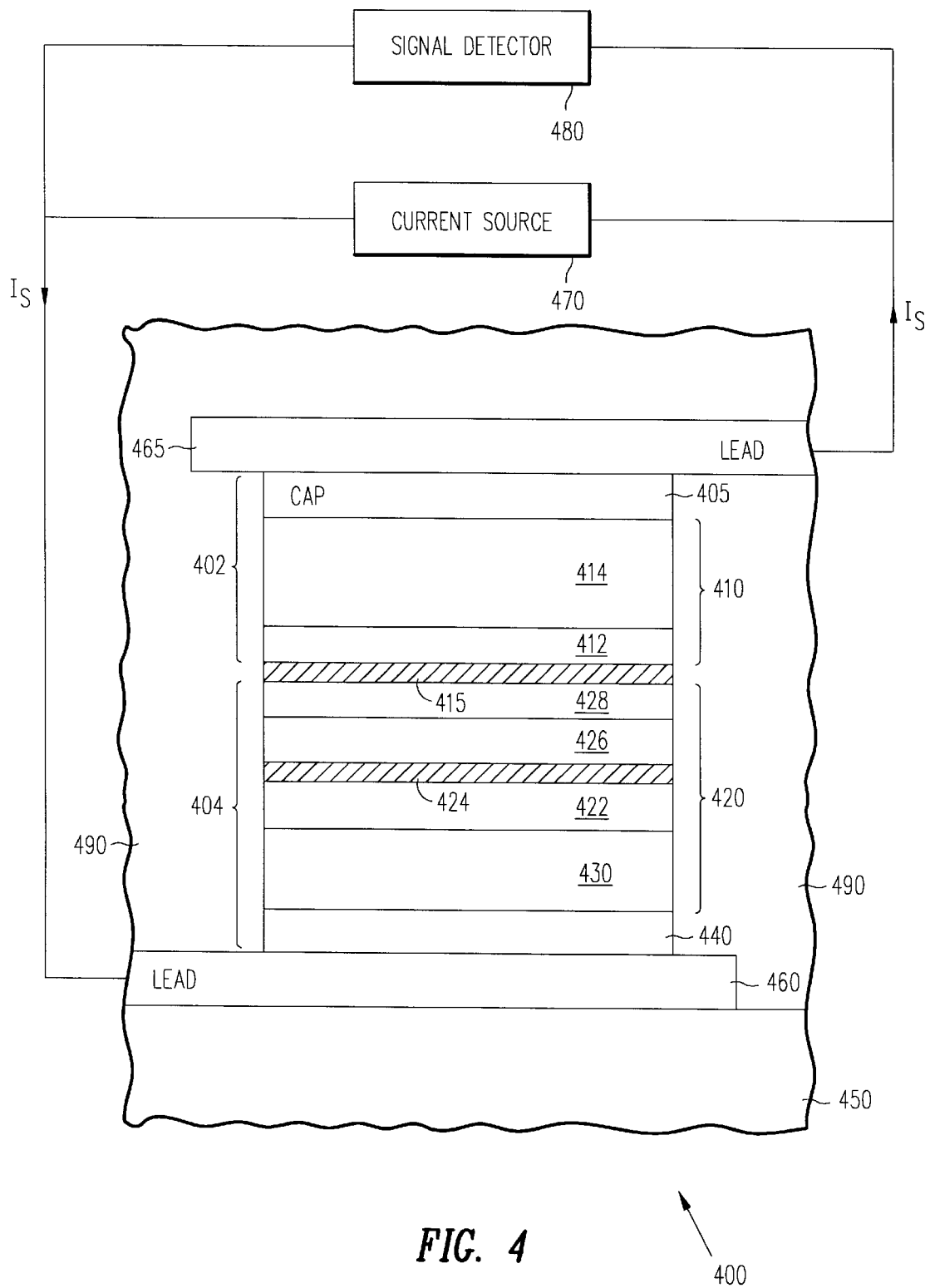
FIG. 4 is an air bearing surface view, not to scale, of an embodiment of an MTJ sensor according to the present invention.

FIG. 4 shows an air bearing surface (ABS) view of an MTJ sensor 400 according to the preferred embodiment of the present invention. The MTJ sensor 400 comprises a first electrode 404, a second electrode 402 and a tunnel barrier layer 415 disposed between the first electrode 404 and the second electrode 402. The first electrode 404 comprises a laminated AP-pinned layer 420 and a seed layer 440, where the laminated AP-pinned layer 420 is disposed between the seed layer 440 and the tunnel barrier layer 415. The second electrode 402 comprises a free layer 410 and a cap layer 405, where the free layer 410 is disposed between the cap layer 405 and the tunnel barrier layer 415.

The laminated AP-pinned layer 420 is an AP-coupled multilayer structure comprising a first ferromagnetic layer 428 with an adjacent first interface layer 426, a second ferromagnetic layer 430 with an adjacent second interface layer 422, and an APC layer 424 disposed between the first interface layer 426 and the second interface layer 422 to provide antiparallel coupling between the first ferromagnetic layer 428 and the second ferromagnetic layer 430. Alternatively, the first interface layer 426 and the second interface layer 422 may not be used. The first ferromagnetic layer 428 is formed of material having a first coercivity and the second ferromagnetic material 430 is formed of material having a second coercivity where the second coercivity is greater than the first coercivity. The second ferromagnetic layer 430 has a high coercivity (greater than 150 Oe) that provides the pinning field to fix (pin) the magnetization direction of the AP-pinned layer 420 perpendicular to the ABS. The seed layer 440 is a layer deposited to modify the crystallographic texture or grain size of the subsequent layers, and may not be needed.

The free layer 410 comprises a first sub-layer 412 and a second sub-layer 414, where the first sub-layer 412 is disposed between the second sub-layer 414 and tunnel barrier layer 415. The magnetization of the free layer 410 is oriented parallel to the ABS and is free to rotate in the presence of a signal magnetic field.

Lead layers 460, 465 adjacent to the first electrode 404 and the second electrode 402, respectively, provide electrical connection for the flow of sensing current $I_s$ from a current source 470 to the MTJ sensor 400. A signal detector 480 which is electrically connected to the leads 460, 465 senses the change in the tunneling current due to changes induced in the free layer 410 by the signal magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a PRML channel as is known to those skilled in the art. The signal detector 480 also includes other supporting circuitries such as a preamplifier (electrically placed between the sensor and the channel) for conditioning the sensed resistance changes as is known to those skilled in the art.

The MTJ sensor 400 is fabricated in a magnetron sputtering or an ion beam sputtering system to sequentially deposit the multilayer structure shown in FIG. 4. The sputter deposition is carried out in the presence of a longitudinal or transverse magnetic field of about 40 Oe to orient the easy axis of all of the ferromagnetic layers. The bottom lead layer 460 formed of gold (Au) having a thickness of about 100–500 Å is deposited on a substrate 450 of preferably $Al_2O_3$. The seed layer 440 formed of Cr having a thickness of about 50 Å is deposited on the lead 460. The AP-pinned layer 420 comprising the second ferromagnetic layer 430, the second interface layer 422, the APC layer 424, the first interface layer 426, and the first ferromagnetic layer 428 are sequentially deposited on the seed layer 440.

The second ferromagnetic layer 430 having a thickness of about 50 Å is formed of $Co_{80}$-$Pt_{12}$-$Cr_8$, a ferromagnetic material having high coercivity that gives it the properties of a hard permanent magnet. The second interface layer 422 is formed of cobalt (Co) having a thickness of about 5 Å. The APC layer 424 is formed of ruthenium (Ru) having a thickness of about 6 A.

The first interface layer 426 is formed of Co having a thickness of about 5 Å and the first ferromagnetic layer 428 having a thickness of about 25 Å is formed of $Co_{30}$-$Fe_{70}$, a ferromagnetic material having high magnetization and therefore expected to have a high tunnel magnetoresistive coefficient.

The tunnel barrier layer 415 is formed of $Al_2O_3$ by depositing and then plasma oxidizing an 8–20 Å aluminum (Al) layer on the first ferromagnetic layer 428.

The free layer 410 comprising the first sub-layer 412 and the second sub-layer 414 is deposited on the tunnel barrier layer 415. The first sub-layer 412 is formed of $Co_{90}$-$Fe_{10}$ having a thickness of about 10 Å deposited on the tunnel barrier layer 415. The $Co_{90}$-$Fe_{10}$ is a ferromagnetic material having a near zero magnetostrictive coefficient. The second sub-layer 414 is formed of Ni—Fe (permalloy) having a thickness of about 20 Å deposited on the first sub-layer 412. The cap layer 405 formed of Ta having a thickness of about 50 Å is deposited on the second sublayer to complete the active portion of MTJ sensor 400.

The top lead 465 formed of gold (Au) having a thickness of 100–500 Å is deposited on the cap layer 405. An insulating layer 490 formed of $Al_2O_3$ deposited between the bottom lead 460 and the top lead 465 provides electrical insulation between the leads and prevents shunting of the sensing current around the MTJ sensor 400.

The use of a high coercivity ferromagnetic material for the second ferromagnetic layer 430 provides the pinning field to fix the magnetization of the laminated AP-pinned layer 420 perpendicular to the ABS. In order to set the magnetization of the pinned layer, the MTJ sensor is placed in a high magnetic field (in the range of 5000–15000 Oe) oriented perpendicular to the ABS. The high coercivity of $Co_{80}$—$Pt_{12}$—$Cr_8$ and it Curie temperature in the range of 500° C. result in a pinning field exceeding 500 Oe with excellent thermal stability for operating temperatures in the range up to about 120–140° C.

In order to prevent the magnetostatic coupling of the high coercivity second ferromagnetic layer 430 to the free layer 410 from impeding the free rotation of the magnetization of the free layer in response to a signal magnetic field, the net magnetic moment of the laminated AP-pinned layer 420 must be reduced to nearly zero by suitable choice of the thicknesses of the layers forming the AP-coupled structure. The magnetic moment of each ferromagnetic layer in the structure is equal to the product of the magnetization of the layer material and the thickness of the layer. Since the magnetizations of the first ferromagnetic layer 428 and the first interface layer 426 are oriented antiparallel to the magnetizations of the second ferromagnetic layer 430 and the second interface layer 422 due to the APC layer 424, the net magnetic moment of the laminated AP-pinned layer 420 can be made nearly zero by having nearly equal total magnetic moments on each side of the APC layer 424.

While $Co_{80}$—$Pt_{12}$—$Cr_8$ was the preferred composition of the second ferromagnetic layer 430, a composition range may be used which is expressed as $Co_x$—$Pt_y$—$Cr_z$, where $68\% \leq x \leq 88\%$, $8\% \leq y \leq 16\%$, $4\% \leq z \leq 16\%$, and $x+y+z=100\%$.

Also, while $Co_{30}$—$Fe_{70}$ was the preferred composition of the first ferromagnetic layer 428, a composition range may be used which is expressed as $Co_a$—$Fe_b$, where $20\% \leq a \leq 50\%$, $50\% \leq b \leq 80\%$, and $a+b=100\%$.

The tunnel magnetoresistance coefficient is proportional to the product of the magnetic flux densities of the free and pinned layers, Therefore, higher flux density (higher magnetization) materials are desired for application as the free and pinned layers in MTJ sensors. The $Co_{30}$—$Fe_{70}$ material used in the preferred embodiment for the first ferromagnetic layer 428 has a very high saturation flux density of 24000 Gauss which should result in a high tunnel magnetoresistance coefficient for the MTJ sensor 400.

Alternative first ferromagnetic layer 430 materials such as Co—Ni, Co—Pt, and Co—Sm may also be used to fabricate MTJ sensors according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

I claim:

1. A magnetic tunnel junction (MTJ) sensor, comprising: an antiparallel (AP)-pinned layer, comprising:
   a first ferromagnetic layer made of a magnetic material having a first coercivity;
   a second ferromagnetic layer made of a magnetic material having a second coercivity, said second coercivity having a magnitude greater than said first coercivity, said second ferromagnetic layer fixing the magnetization direction of said AP-pinned layer; and
   an antiparallel coupling (APC) layer disposed between said first and second ferromagnetic layers;
      a free layer of ferromagnetic material; and
      a tunnel barrier layer disposed between said first ferromagnetic layer and said free layer.

2. The MTJ sensor as recited in claim 1, wherein said first ferromagnetic layer is made of $Co_{30}$—$Fe_{70}$ and said second ferromagnetic layer is made of $Co_{80}$—$Pt_{12}$—$Cr_8$.

3. The MTJ sensor as recited in claim 2, wherein the thickness of said second ferromagnetic layer is twice the thickness of said first ferromagnetic layer.

4. The MTJ sensor as recited in claim 1, wherein said first ferromagnetic layer is made of $Co_a$—$Fe_b$ where $20\% \leq a \leq 50\%$, $50\% \leq b \leq 80\%$, and $a+b=100\%$.

5. The MTJ sensor as recited in claim 1, wherein the second ferromagnetic layer is made of $Co_x$—$Pt_y$—$Cr_z$ where $68\% \leq x \leq 88\%$, $8\% \leq y \leq 16\%$, $4\% \leq z \leq 16\%$, and $x+y+z=100\%$.

6. The MTJ sensor as recited in claim 1, wherein said second ferromagnetic material is chosen from a group of materials including Co—Ni, Co—Pt, and Co—Sm.

7. The MTJ sensor as recited in claim 1, wherein said second coercivity of said second ferromagnetic layer is greater than 150 Oe.

8. A magnetic tunnel junction (MTJ) sensor, comprising: an antiparallel (AP) pinned layer, comprising:
   a first ferromagnetic layer made of a magnetic material having a first coercivity;
   a first interface layer of ferromagnetic material in contact with said first ferromagnetic layer;
   a second ferromagnetic layer made of a magnetic material having a second coercivity, said second coercivity having a magnitude greater than said first coercivity, said second ferromagnetic layer fixing the magnetization direction of said AP-pinned layer;
   a second interface layer of ferromagnetic material in contact with said second ferromagnetic layer; and
   an antiparallel coupling (APC) layer disposed between said first and second interface layers;
   a free layer comprising:
      a first sub-layer of ferromagnetic material; and
      a second sub-layer of ferromagnetic material in contact with said first sub-layer; and
   a tunnel barrier layer disposed between said first ferromagnetic layer and said first sub-layer of said free layer.

9. The MTJ sensor as recited in claim 8, wherein said first ferromagnetic layer is made of $Co_{30}$—$Fe_{70}$ and said second ferromagnetic layer is made of $Co_{80}$—$Pt_{12}$—$Cr_8$.

10. The MTJ sensor as recited in claim 9, wherein the thickness of said second ferromagnetic layer is twice the thickness of said first ferromagnetic layer.

11. The MTJ sensor as recited in claim 8, wherein said first ferromagnetic layer is made of $Co_a$—$Fe_b$ where $20\% \leq a \leq 50\%$, $50\% \leq b \leq 80\%$, and $a+b=100\%$.

12. The MTJ sensor as recited in claim 8, wherein the second ferromagnetic layer is made of $Co_x$—$Pt_y$—$Cr_z$ where $68\% \leq x \leq 88\%$, $8\% \leq y \leq 16\%$, $4\% \leq z \leq 16\%$, and $x+y+z=100\%$.

13. The MTJ sensor as recited in claim 8, wherein said second ferromagnetic layer is chosen from a group of materials including Co—Ni, Co—Pt, and Co—Sm.

14. The MTJ sensor as recited in claim 8, wherein said first and second interface layers are made of cobalt.

15. The MTJ sensor as recited in claim 8, wherein said first sub-layer is made of $Co_{90}$—$Fe_{10}$.

16. The MTJ sensor as recited in claim 8, wherein said second sub-layer is made of Ni—Fe (permalloy).

17. The MTJ sensor as recited in claim 8, wherein said APC layer is selected from a group of materials consisting of ruthenium, indium, and rhodium.

18. The MTJ sensor as recited in claim 8, wherein said tunnel barrier layer is made of $Al_2O_3$.

19. The MTJ sensor as recited in claim 8, wherein said second coercivity of said second ferromagnetic layer is greater than 150 Oe.

20. A disk drive system, comprising:
   a magnetic recording disk;
   a magnetic tunnel junction (MTJ) magnetoresistive sensor for sensing magnetically recorded data on said magnetic recording disk, said MTJ sensor comprising:
      an antiparallel (AP) pinned layer, comprising:
         a first ferromagnetic layer made of a magnetic material having a first coercivity;
         a second ferromagnetic layer made of a magnetic material having a second coercivity, said second coercivity having a magnitude greater than said first coercivity, said second ferromagnetic layer fixing the magnetization direction of said AP-pinned layer; and
         an antiparallel coupling (APC) layer disposed between said first and second ferromagnetic layers;
      a free layer of ferromagnetic material; and
      a tunnel barrier layer disposed between said first ferromagnetic layer and said free layer;
   an actuator for moving said MTJ sensor across the magnetic recording disk so the MTJ sensor may access different regions of magnetically recorded data on the magnetic recording disk; and
   a recording channel coupled electrically to the MTJ sensor for detecting changes in resistance of the MTJ sensor caused by rotation of the magnetization axis of the free ferromagnetic layer relative to the fixed magnetization of the pinned layer in response to magnetic fields from the magnetically recorded data.

21. The disk drive system as recited in claim 20, wherein said first ferromagnetic layer is made of $Co_{30}$—$Fe_{70}$ and said second ferromagnetic layer is made of $Co_{80}$—$Pt_{12}$—$Cr_8$.

22. The disk drive system as recited in claim 21, wherein the thickness of said second ferromagnetic layer is twice the thickness of said first ferromagnetic layer.

23. The disk drive system as recited in claim 20, wherein said first ferromagnetic layer is made of $Co_a$—$Fe_b$ where $20\% \leq a \leq 50\%$, $50\% \leq b \leq 80\%$, and $a+b=100\%$.

24. The disk drive system as recited in claim 20, wherein the second ferromagnetic layer is made of $Co_x$—$Pt_y$—$Cr_z$ where $68\% \leq x \leq 88\%$, $8\% \leq y \leq 16\%$, $4\% \leq z \leq 16\%$, and $x+y+z=100\%$.

25. The disk drive system as recited in claim 20, wherein said second ferromagnetic material is chosen from a group of materials including Co—Ni, Co—Pt, and Co—Sm.

26. The disk drive system as recited in claim 20, wherein said second coercivity of said second ferromagnetic layer is greater than 150 Oe.

27. A disk drive system, comprising:
   a magnetic recording disk;
   a magnetic tunnel junction (MTJ) magnetoresistive sensor for sensing magnetically recorded data on said magnetic recording disk, said MTJ sensor comprising:
      an antiparallel (AP) pinned layer, comprising:
         a first ferromagnetic layer made of a magnetic material having a first coercivity;
         a first interface layer of ferromagnetic material in contact with said first ferromagnetic layer;
         a second ferromagnetic layer made of a magnetic material having a second coercivity, said second coercivity having a magnitude greater than said first coercivity, said second ferromagnetic layer fixing the magnetization direction of said AP-pinned layer;
         a second interface layer of ferromagnetic material in contact with said second ferromagnetic layer; and
         an antiparallel coupling (APC) layer disposed between said first and second interface layers;
      a free layer comprising:
         a first sub-layer of ferromagnetic material; and
         a second sub-layer of ferromagnetic material in contact with said first sub-layer; and
      a tunnel barrier layer disposed between said first ferromagnetic layer and said first sub-layer of said free layer;
   an actuator for moving said MTJ sensor across the magnetic recording disk so the MTJ sensor may access different regions of magnetically recorded data on the magnetic recording disk; and
   a recording channel coupled electrically to the MTJ sensor for detecting changes in resistance of the MTJ sensor caused by rotation of the magnetization axis of the free ferromagnetic layer relative to the fixed magnetization of the pinned layer in response to magnetic fields from the magnetically recorded data.

28. The disk drive system as recited in claim 27, wherein said first ferromagnetic layer is made of $Co_{30}$—$Fe_{70}$ and said second ferromagnetic layer is made of $Co_{80}$—$Pt_{12}$—$Cr_8$.

29. The disk drive system as recited in claim 28, wherein the thickness of said second ferromagnetic layer is twice the thickness of said first ferromagnetic layer.

30. The disk drive system as recited in claim 27, wherein said first ferromagnetic layer is made of $Co_a$—$Fe_b$ where $20\% \leq a \leq 50\%$, $50\% \leq b \leq 80\%$, and $a+b=100\%$.

31. The disk drive system as recited in claim 27, wherein the second ferromagnetic layer is made of $Co_x$—$Pt_y$—$Cr_z$ where $68\% \leq x \leq 88\%$, $8\% \leq y \leq 16\%$, $4\% \leq z \leq 16\%$, and $x+y+z=100\%$.

32. The disk drive system as recited in claim 27, wherein said second ferromagnetic material is chosen from a group of materials including Co—Ni, Co—Pt, and Co—Sm.

33. The disk drive system as recited in claim 27, wherein said first and second interface layers are made of cobalt.

34. The disk drive system as recited in claim 27, wherein said first sub-layer is made of $Co_{90}$—$Fe_{10}$.

35. The disk drive system as recited in claim 27, wherein said second sub-layer is made of Ni—Fe (permalloy).

36. The disk drive system as recited in claim 27, wherein said second coercivity of said second ferromagnetic layer is greater than 150 Oe.

* * * * *